(12) United States Patent
Ausserlechner

(10) Patent No.: US 7,980,138 B2
(45) Date of Patent: Jul. 19, 2011

(54) INTEGRATED CIRCUIT WITH STRESS SENSING ELEMENT

(75) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 357 days.

(21) Appl. No.: 11/927,165

(22) Filed: Oct. 29, 2007

(65) Prior Publication Data

US 2009/0108839 A1    Apr. 30, 2009

(51) Int. Cl.
*G01L 1/00* (2006.01)
(52) U.S. Cl. ......................................... 73/763
(58) Field of Classification Search ............ 73/777; 257/162
See application file for complete search history.

(56) References Cited

U.S. PATENT DOCUMENTS

| | | | |
|---|---|---|---|
| 3,336,795 A * | 8/1967 | Kiyoshi | 73/862.339 |
| 6,906,514 B2 | 6/2005 | Ausserlechner | |
| 7,255,010 B2 | 8/2007 | Ausserlechner | |
| 2005/0162160 A1 | 7/2005 | Ausserlechner et al. | |
| 2005/0211980 A1 | 9/2005 | Fischer et al. | |
| 2007/0018655 A1 | 1/2007 | Ausserlechner et al. | |
| 2007/0063309 A1 | 3/2007 | Ausserlechner | |
| 2007/0176182 A1 * | 8/2007 | Wen et al. | 257/79 |

FOREIGN PATENT DOCUMENTS

| | | |
|---|---|---|
| DE | 10154497 | 5/2003 |
| DE | 102004034277 | 2/2006 |
| DE | 102005008724 * | 9/2006 |
| DE | 102005008772 | 9/2006 |

OTHER PUBLICATIONS

U. Ausserlechner article entitled "Stabiler Hallsonden IC;" © 2004; 2 pgs.
U. Ausserlechner article entitled "MOS-Stress-Sensor;" © 2005; 2 pgs.
U. Ausserlechner article entitled "Oszillator Stress-Sensor;" © 2005; 4 pgs.
Dr. Udo Ausserlechner, article entitled "Oscillator Stress Sensor," 6 pgs.; © 2005.
Udo Ausserlechner, article entitled "Stable Hall Probe IC," 3 pgs.; © 2004.
Dr. Udo Ausserlechner, article entitled "MOS-Stress-Sensor," 5 pgs.; © 2005.

* cited by examiner

*Primary Examiner* — Lisa M Caputo
*Assistant Examiner* — Octavia Davis
(74) *Attorney, Agent, or Firm* — Dicke, Billig & Czaja, PLLC

(57) ABSTRACT

An integrated circuit includes a semiconductor die, and a stress sensing element. The stress sensing element comprises a first lateral resistor and a first vertical resistor. The stress sensing element is formed in the semiconductor die and is configured to indicate a level of at least one stress component within the semiconductor die.

25 Claims, 9 Drawing Sheets

INTEGRATED CIRCUIT WITH STRESS SENSING ELEMENT

BACKGROUND

Integrated circuits (ICs) are typically mounted in packages to protect the sensitive integrated circuitries from environmental influences. However, one disadvantageous side effect that may be observed is that mounting the integrated circuitry in a package exerts mechanical stress on the semiconductor material. Mechanical stress on integrated circuits changes electronic parameters, such as the magnetic sensitivity of Hall plates or the resistance of resistors. Mechanical stress changes the mobility and the scatter factor of charge carriers, which causes lifetime drifts of resistances, transistor parameters, and the magnetic sensitivity of Hall plates (known as piezo-resistivity effect, piezo-MOS effect, piezo-junction effect, and piezo-Hall effect).

Lifetime drift of mechanical stress originates from changes of the thermo-mechanical properties of the package constituents (e.g. ageing or chemical reactions in the mold compound or swelling of the mold compound due to moisture ingress), and typically cannot be avoided. Silicon Hall sensors are known to suffer from a long term drift in magnetic sensitivity between 1% and 4% depending upon the degree of moisture in the mold compound of the package.

SUMMARY

One embodiment provides an integrated circuit, including a semiconductor die, and a stress sensing element. The stress sensing element comprises a first lateral resistor and a first vertical resistor. The stress sensing element is formed in the semiconductor die and is configured to indicate a level of at least one stress component within the semiconductor die.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One embodiment provides an integrated circuit that is configured to measure mechanical stress, and on the basis of this measurement, counteracts the influence of stress on circuit parameters. Another embodiment provides an integrated circuit that is insensitive to mechanical stress. In one embodiment, the integrated circuit includes two similar electronic components in a semiconductor die (e.g., a lateral resistor in an L-layout and a vertical resistor) with identical or substantially similar temperature behavior and strongly correlated process spreads, but with different stress dependency (i.e., the components react very differently to mechanical stress). In one embodiment, the two electronic components are used by the integrated circuit to cancel the overall stress effects in the integrated circuit. One embodiment provides a Hall sensor integrated circuit that continuously measures relevant stress components, estimates the sensitivity drift, and digitally corrects for the sensitivity drift.

Figure 1A:
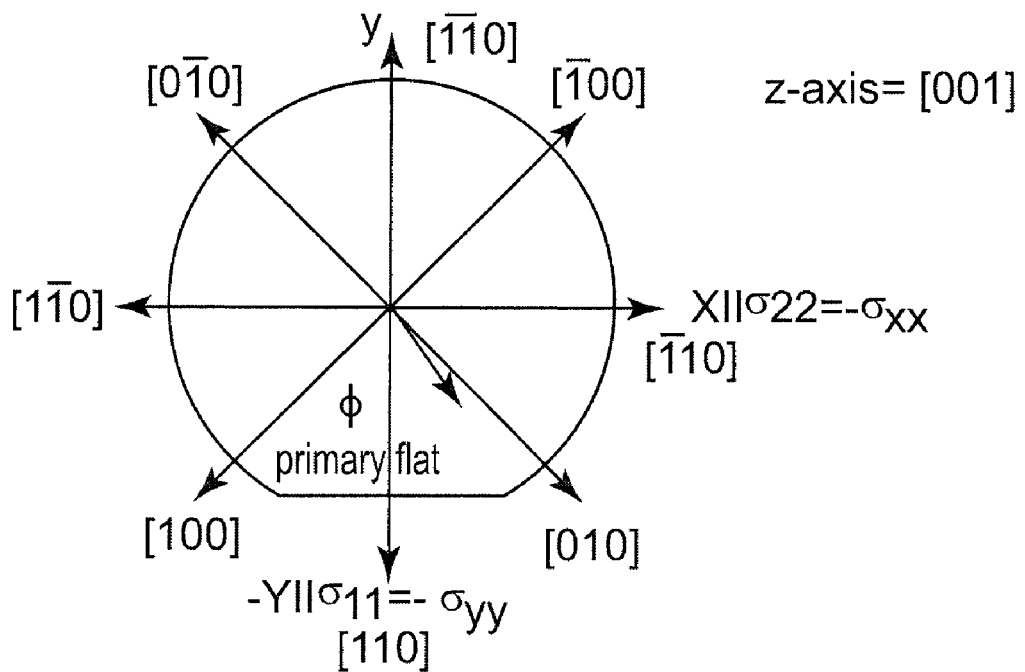
FIGS. 1A and 1B are diagrams illustrating direction designations according to one embodiment.
Figure 1B:
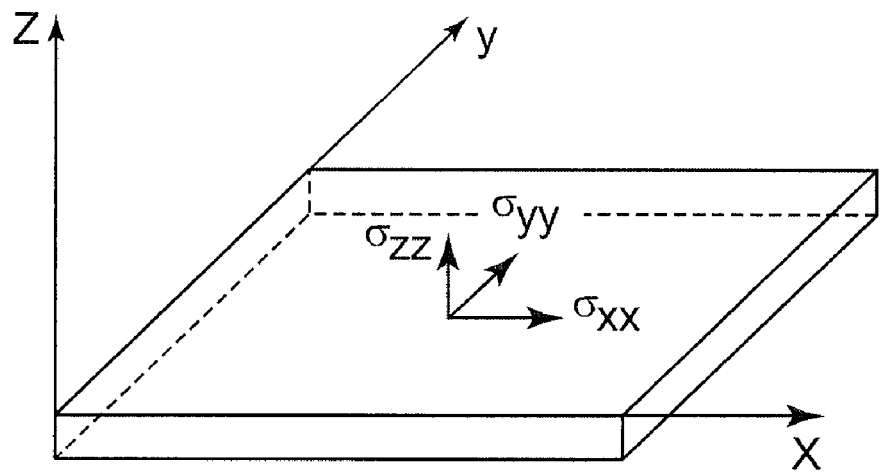

FIGS. 1A and 1B are diagrams illustrating direction designations according to one embodiment. Since the piezo-effects mentioned in the Background section are directional, which means that they depend on the relative orientation of a semiconductor element with regard to the crystal structure of a semiconductor substrate, the crystallographic orientations relevant in the production of integrated semiconductor circuits will be described below with reference to FIGS. 1A and 1B.

For producing integrated circuits, the semiconductor wafers (e.g., silicon wafers or silicon slices) are sawn from a single crystal rod, such that the wafer surface is associated to a crystallographic plane. In order to determine the respective plane in a cubic crystal, the so called "Miller indices" are used, which are indicated below in round brackets. FIG. 1A shows, for example, a top view of a semiconductor wafer that is cut in the (100) plane.

The major crystallographic directions in the wafer plane are indicated in FIGS. 1A and 1B, wherein the producers of these silicon wafers provide a so-called "primary flat" at the silicon slice. Normally, the edges of the square geometries of the circuit structures run on the semiconductor chip in parallel or perpendicular to the primary flats. In FIG. 1A, the crystallographic directions or axes are illustrated in the plane of the semiconductor wafer, wherein the same are indicated below in square brackets. The coordinate system is usually used such that the [110] direction runs perpendicular to the primary flat, while the [$\bar{1}$10] direction runs parallel to the primary flat. The directions [010] and [100] run at an angle of +/−45° to the [110] direction.

Further, an angle φ is defined with respect to the [110] direction, wherein in the top view on the wafer surface, the angle φ is counted counter-clockwise starting from the [110] direction. Normally, the individual chips in the wafer are positioned such that the directions φ=0° and φ=90° correspond to the IC vertical or horizontal direction, respectively, wherein these directions can be exchanged, depending on whether the IC is on edge or horizontal. Further, the direction φ=90° will be designated below as x-axis ([$\bar{1}$10] direction) and the direction φ=0° as negative y-axis ([$\bar{1}$10] direction).

Stress is not a scalar but a tensor having 6 components: 3 normal stresses and 3 shear stresses. When referring to the measurement of stress or insensitivity to stress, it should be clarified whether the stress includes all stress components, or only one particular stress component, or a certain combination of stress components. There do not appear to be any integrated circuits that measure all stress components on-chip. It is possible to measure all stress components via rosettes of resistors having p-type and n-type doping and at least 3 different directions in the (111)-Si-plane. However, the measurement is not done completely on-chip, since the measurement involves comparing these resistances with a reference resistance that is independent of stress (e.g., an Ohmmeter).

On the other hand, it is not typically sufficient to measure only a single stress component, because all circuit elements are typically affected by at least two stress components. For example, the current-related magnetic sensitivity of planar Hall sensors in (100)-Si (which is commonly used in modern CMOS technologies) depends on a linear combination of the sum of the normal stress components in the wafer plane and the vertical stress component, as shown in the following Equation I (with x and y axes that are parallel to the edges of the die and a z-axis that is perpendicular to the die):

$$S_i = S_{i,0}(1 + P''_{12}(\sigma_{xx} + \sigma_{yy}) + P''_{11}\sigma_{zz}) \qquad \text{Equation I}$$

Where:
$S_i$=current-related magnetic sensitivity of Hall sensor;
$S_{i,0}$=current-related magnetic sensitivity of Hall sensor at zero stress;
$P''_{11}$ and $P''_{12}$=piezo-Hall coefficients for an n-doped Hall sensor;
$\sigma_{xx}$=normal stress component along the x-axis;
$\sigma_{yy}$=normal stress component along the y-axis; and
$\sigma_{zz}$=normal stress component along the z-axis.

The current related magnetic sensitivity of the Hall sensor is defined as the ratio of output voltage change over magnetic field change and Hall input current as shown in the following Equation II:

$$S_{i,0} = \frac{1}{I_H} \frac{\partial V_{out}}{\partial B_z} \qquad \text{Equation II}$$

Where:
$S_{i,0}$=current-related magnetic sensitivity of Hall sensor at zero stress;
$I_H$=current flowing through the Hall plate;
$V_{out}$=output voltage of the Hall plate; and
$B_z$=z-component of the magnetic flux density acting on the Hall sensor.

The piezo-Hall coefficients (e.g., $P''_{11}$ and $P''_{12}$) indicate how much the current-related magnetic sensitivity of the Hall sensor changes if mechanical stress acts on it. For an n-doped Hall sensor, $P''_{11}$=−88%/GPa and $P''_{12}$=44%/GPa, where 1 GPa=$10^9$ Pa (Pascal).

For resistors, the stress dependency is more complicated than for Hall sensors, because for lateral resistors (i.e., the current flows in the wafer plane), the exact orientation of the resistor matters, and also shear stress components affect the resistance value. In the coordinate system of a silicon crystal, the stress-related resistance can be written as shown in the following Equation III:

$$\frac{1}{\rho_0}\begin{pmatrix}\Delta\rho_{xx}\\\Delta\rho_{yy}\\\Delta\rho_{zz}\\\Delta\rho_{xz}\\\Delta\rho_{yz}\\\Delta\rho_{xy}\end{pmatrix} = \begin{pmatrix}\pi_{11} & \pi_{12} & \pi_{12} & 0 & 0 & 0\\\pi_{12} & \pi_{11} & \pi_{12} & 0 & 0 & 0\\\pi_{12} & \pi_{12} & \pi_{11} & 0 & 0 & 0\\0 & 0 & 0 & \pi_{44} & 0 & 0\\0 & 0 & 0 & 0 & \pi_{44} & 0\\0 & 0 & 0 & 0 & 0 & \pi_{44}\end{pmatrix}\begin{pmatrix}\sigma_{xx}\\\sigma_{yy}\\\sigma_{zz}\\\sigma_{xz}\\\sigma_{yz}\\\sigma_{xy}\end{pmatrix} \qquad \text{Equation III}$$

Where:
$\rho_0$=specific resistivity of the material at zero stress;
$\Delta\rho$=specific resistivity at stress minus the specific resistivity at zero stress, $\rho_0$;
$\pi$=piezo-resistivity coefficients;
$\sigma_{xx}$, $\sigma_{yy}$, and $\sigma_{zz}$=normal stress components; and
$\sigma_{xz}$, $\sigma_{yz}$, and $\sigma_{xy}$=shear stress components.

Due to the cubic symmetry of the crystal, only three piezo coefficients are needed (i.e., $\pi_{11}$, $\pi_{12}$, and $\pi_{44}$). For n-doped resistors, the values of these coefficients are as follows: $\pi''_{11}$=−102.2%/GPa, $\pi''_{12}$=53.4%/GPa, and $\pi''_{44}$=−13.6%/GPa. For p-doped resistors, the values of these coefficients are as follows: $\pi^p_{11}$=6.6%/GPa, $\pi^p_{12}$=−1.1%/GPa, $\pi^p_{44}$=138.1%/GPa.

Along the three principal axes (x, y, and z), the matrix equation given in the above Equation III may be rewritten as shown in the following Equations IV, V, and VI:

$$\frac{\Delta\rho_{xx}}{\rho_0} = \pi_{11}\sigma_{xx} + \pi_{12}(\sigma_{yy} + \sigma_{zz}) \qquad \text{Equation IV}$$

$$\frac{\Delta\rho_{yy}}{\rho_0} = \pi_{11}\sigma_{yy} + \pi_{12}(\sigma_{xx} + \sigma_{zz}) \qquad \text{Equation V}$$

$$\frac{\Delta\rho_{zz}}{\rho_0} = \pi_{11}\sigma_{zz} + \pi_{12}(\sigma_{xx} + \sigma_{yy}) \qquad \text{Equation VI}$$

For two lateral resistor strips with perpendicular direction connected in series (i.e., an L-layout), the overall resistance depends on the mechanical stress as shown in the following Equation VII:

$$R_L = R_{L0}\left(1 + \frac{\pi_{11} + \pi_{12}}{2}(\sigma_{xx} + \sigma_{yy}) + \pi_{12}\sigma_{zz}\right) \qquad \text{Equation VII}$$

Where:
$R_L$=overall resistance of two lateral resistor strips;
$R_{L0}$=overall resistance of two lateral resistor strips at zero stress;
$\pi_{11}$ and $\pi_{12}$=piezo-resistivity coefficients; and $\sigma_{xx}$, $\sigma_{yy}$, and $\sigma_{zz}$=normal stress components.

For n-doped resistors, $(\pi^n_{11}+\pi^n_{12})/2=-24.4\%/\text{Gpa}$, and for p-doped resistors, $(\pi^p_{11}+\pi^p_{12})/2=2.75\%/\text{Gpa}$.

Vertical stress ($\sigma_{zz}$) on a semiconductor die in typical packages is negligible because of the flat layered structure of a typical package. The sum of the in-plane normal stress components ($\sigma_{xx}+\sigma_{yy}$) is more important for practical stress compensation purposes. Thus, one embodiment is directed to measuring and compensating only the in-plane normal stress components.

By using both p-type and n-type resistors in an integrated circuit, an overall resistance with zero stress dependency can be produced. The p-type and n-type resistors each include two resistors or resistor strips of the same size, connected in series, and having a perpendicular orientation with respect to each other, so they each form what is referred to herein as an L-layout or a "resistor-L". A voltage, U, is copied onto the two resistor-Ls, which are connected in series. With each type of resistor-L (i.e., n-type and p-type), one can generate a current (I=U/R), such that the current, I, goes up if the resistance, R, goes down due to stress. By adding or subtracting such properly scaled currents, one can obtain any current with any kind of stress dependency. One may also construct a current, which has the inverse stress dependence as the Hall-plate, so that the Hall output signal is independent of stress, if one supplies the Hall plate with this current. One may also use one type of resistor-L (e.g., p-type) to generate a current, and impress this current onto the converse type of resistor-L (e.g., n-type), and thereby produce a stress sensor (i.e., the output voltage depends on stress). The resulting voltage has a strong stress dependence of $-24.4-2.75=-27.15\%/\text{GPa}$.

There are problems with using both p-type and n-type resistors for stress measurement and stress compensation. Each resistor can have a process spread of +/−20% if the doping concentration is not carefully controlled, or if the depth and the spreads of the n-type and p-type resistors are not correlated, since n-type and p-type resistors are made in different process steps. In addition, n-type and p-type resistors have different temperature behavior, which means that the output voltage of the stress sensor depends not only on stress, but also on temperature. In fact, the temperature dependence can be much larger than the stress dependence.

The different temperature behavior of n-type and p-type resistors can be a problem for stress sensors. For example, assuming that the p-type resistor has a temperature coefficient of $3.3*10^{-3}/°\text{C}$. and the n-type resistor has a temperature coefficient of $5.5*10^{-3}/°\text{C}$., then the stress sensor has a temperature coefficient of $5.5-3.3=2.2*10^{-3}/°\text{C}$. If the temperature rises by just 1° C., the output voltage increases by 0.22%. As mentioned above, the stress dependence of the stress sensor is −27.15%/GPa. So a stress reduction of 8 MPa increases the output of the stress sensor by 0.22%. A temperature sensor may be used in combination with the stress sensor to compensate for the temperature dependence of the sensor. However, this increases overall system complexity, consumption of chip space, and test time for precise multi-temperature calibration procedures. In addition, since it is very difficult to measure the junction temperature with an accuracy of 1° C., it is also difficult to resolve stress changes below 8 MPa.

Instead of using lateral p-type and lateral n-type resistor-Ls, one embodiment provides an integrated stress sensor or stress sensing element that includes a lateral n-type resistor-L (i.e., two n-type resistor strips positioned at a 90 degree orientation with respect to each other connected in series) and a vertical n-type resistor, which are formed in a semiconductor die. A vertical resistor according to one embodiment means a resistor in which the current flows predominantly in a direction perpendicular to the wafer plane or plane of the semiconductor die. By using the same type of doping (e.g., n-type) for the resistors, the temperature problems of stress sensors that use different types of resistor doping are avoided. The lateral and vertical resistors act differently in response to stress since the current direction is different.

Figure 2:
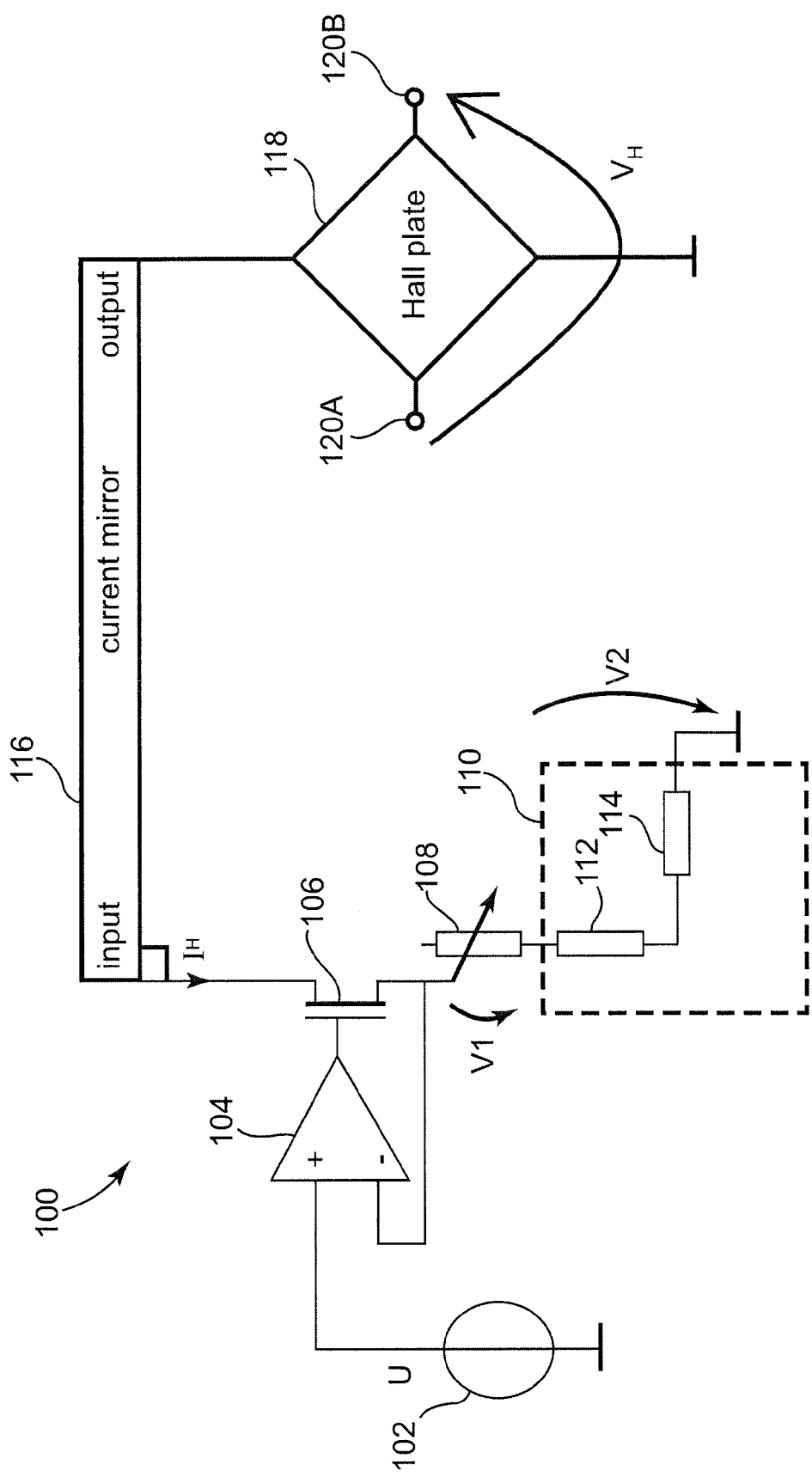
FIG. 2 is a block diagram illustrating a stress-insensitive Hall sensor integrated circuit according to one embodiment.

FIG. 2 is a block diagram illustrating a stress-insensitive Hall sensor integrated circuit 100 according to one embodiment. Circuit 100 includes a voltage source 102, operational amplifier 104, transistor 106, vertical n-type resistor 108, lateral n-type resistor-L 110, current mirror 116, and Hall plate 118. The lateral n-type resistor-L 110 includes two lateral n-type resistor portions or resistors 112 and 114, which are oriented perpendicularly with respect to each other, and which are connected in series with each other and with the vertical n-type resistor 108.

In one embodiment, transistor 106 is an NMOS FET. Voltage source 102 provides a voltage, U, to the positive input terminal of the operational amplifier 104. The voltage, U, may be generated using known bandgap principles, in a manner that is relatively constant in relation to mechanical stress in the semiconductor material. The negative input terminal of the operational amplifier 104 is connected between resistor 108 and the source of transistor 106. The output of the operational amplifier 104 is connected to the gate of the transistor 106. The drain of transistor 106 is connected to the input of the current mirror 116. In one embodiment, current mirror 116 is a PMOS current mirror. The operational amplifier 104 and the transistor 106 cause the voltage, U, to be copied to the source of the transistor 106. Thus, the total voltage drop across the resistors 108 and 110 is equal to U. The voltage drop across vertical n-type resistor 108 is represented by V1, and the voltage drop across lateral n-type resistor-L 110 is represented by V2, so U is equal to V1 plus V2.

The circuit 100 generates a current, $I_H$, which flows through the transistor 106 and the resistors 108 and 110. The current mirror 116 causes the current $I_H$ to be reproduced at its output, thereby causing the current $I_H$ to also flow through the Hall plate 118. The Hall plate 118 generates an output voltage, $V_H$, which is measured at output terminals 120A and 120B, and which varies based on the strength of a magnetic field applied to the Hall plate 118.

In one embodiment, one or more of the resistors 108 and 110 are formed in an n-tub. Since the depth of the n-tub may have a process spread, in one embodiment, at least one of the two resistors 108 and 110 is tapped in order to trim it. The arrow across the resistor 108 shown in FIG. 2 indicates that the resistance of the resistor 108 is variable. In one embodiment, resistor 108 is trimmed to achieve a V1/V2 ratio given in the following Equation VIII:

$$\frac{V_1}{V_2} = \frac{R_{n,V}}{R_{n,L}} \qquad \text{Equation VIII}$$

$$= \frac{P^n_{12} - (\pi^n_{11} + \pi^n_{12})/2}{\pi^n_{12} - P^n_{12}}$$

$$\cong \frac{44 - (-24.4)}{53.4 - 44}$$

$$= 7.28$$

Where:
$R_{n,V}$=resistance of vertical n-type resistor 108;
$R_{n,L}$=resistance of lateral n-type resistor-L 110;
$P^n_{12}$=piezo-Hall coefficient for an n-doped Hall sensor; and $\pi''_{11}$ and $\pi''_{12}$=piezo-resistivity coefficients of an n-type resistor.

Thus, as indicated by Equation VIII, the vertical resistor 108 according to one embodiment has a resistance that is about 7.3 times larger than that of the lateral resistor 110. With this ratio, the circuit 100 generates a current $I_H$ that varies with stress in such a manner as to cancel the stress dependence of the Hall plate 118 (i.e., the Hall plate 118 generates an output Hall voltage that is independent of stress), and the overall magnetic sensitivity of the Hall sensor 100 is constant with respect to mechanical stress. In another embodiment, the ratio given in Equation VIII is in the range of 7 to 8.5. The ratio depends upon the numerical values that are used for the piezo-coefficients.

Instead of connecting the vertical resistor 108 in series with the lateral resistor-L 110 as shown in FIG. 2, in another embodiment, the resistors 108 and 110 are connected in parallel. In this embodiment, the ratio given in Equation VIII is different. In one form of this embodiment, the ratio of the resistance of resistor 110 to the resistance of resistor 108 is in the range of 4 to 7. The ratio depends on the lateral stress ($\sigma_{xx}+\sigma_{yy}$) acting on the die, which is assumed here to be between 0 and −300 MPa. An exact solution can be obtained by setting the derivative of the overall magnetic sensitivity of the Hall sensor 100 with respect to $\sigma_{xx}+\sigma_{yy}$ equal to zero. In yet another embodiment, the lateral resistor-L 110 is replaced by a single resistor strip aligned along the [100] or [010] direction at a location in the die where shear stress vanishes (e.g., at or near the center of the die). In one form of this embodiment, the single resistor strip is positioned at a distance of T or greater from the nearest edge of the die, where T is the thickness of the die.

Figure 3:
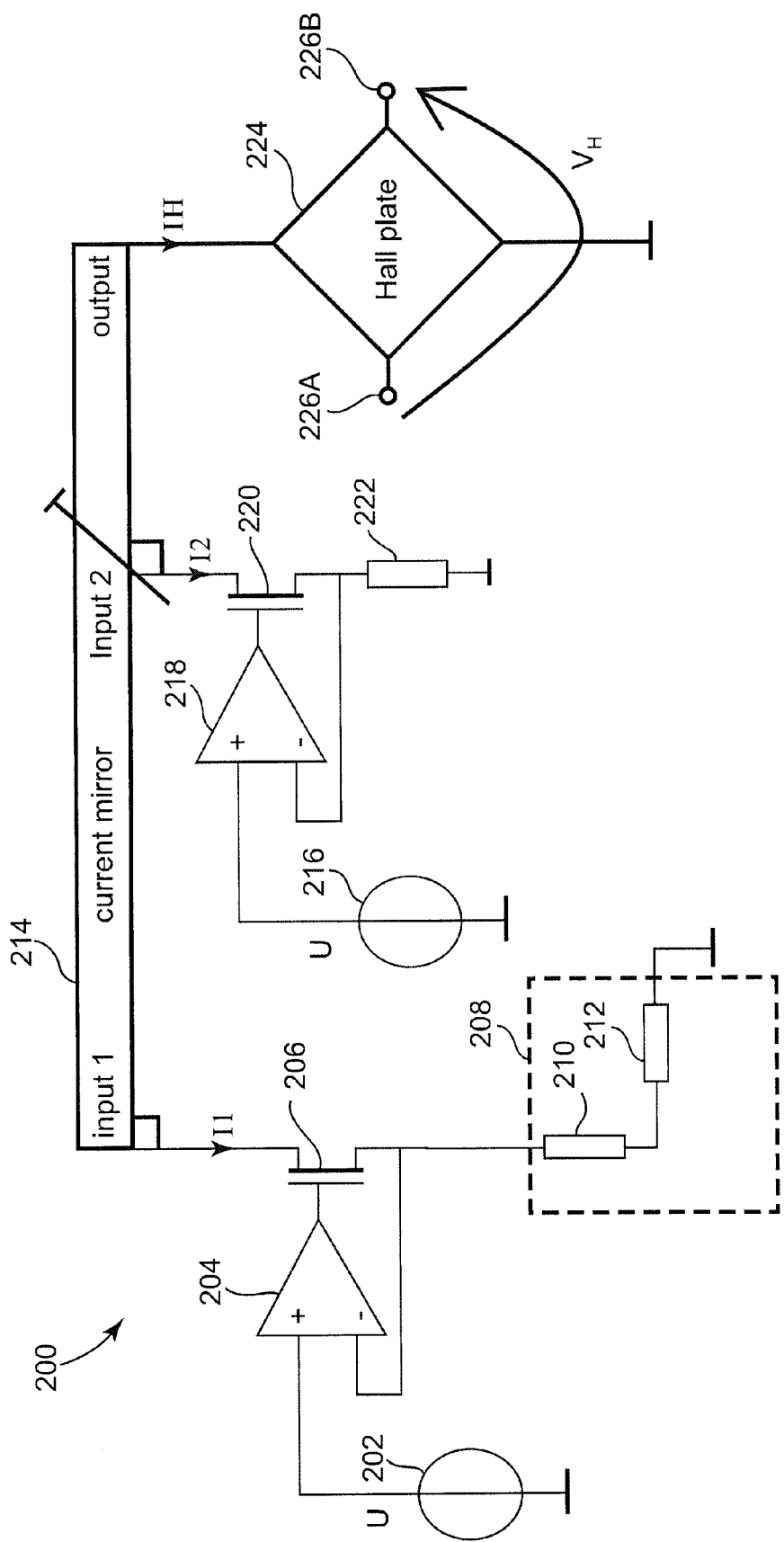
FIG. 3 is a block diagram illustrating a stress-insensitive Hall sensor integrated circuit according to another embodiment.

FIG. 3 is a block diagram illustrating a stress-insensitive Hall sensor integrated circuit 200 according to another embodiment. Circuit 200 includes a first voltage source 202, first operational amplifier 204, first transistor 206, lateral n-type resistor-L 208, current mirror 214, second voltage source 216, second operational amplifier 218, second transistor 220, vertical n-type resistor 222, and Hall plate 224. The lateral n-type resistor-L 208 includes two lateral n-type resistor portions or resistors 210 and 212, which are oriented perpendicularly with respect to each other, and which are connected in series with each other.

In one embodiment, transistors 206 and 220 are NMOS FETs. Voltage source 202 provides a voltage, U, to the positive input terminal of the operational amplifier 204. The negative input terminal of the operational amplifier 204 is connected between resistor 208 and the source of transistor 206. The output of the operational amplifier 204 is connected to the gate of the transistor 206. The drain of transistor 206 is connected to a first input (Input1) of the current mirror 214. In one embodiment, current mirror 214 is a PMOS current mirror. The operational amplifier 204 and the transistor 206 cause the voltage, U, to be copied to the source of the transistor 206. Thus, the total voltage drop across the resistor 208 is equal to U.

Voltage source 216 provides a voltage, U, to the positive input terminal of the operational amplifier 218. The negative input terminal of the operational amplifier 218 is connected between resistor 222 and the source of transistor 220. The output of the operational amplifier 218 is connected to the gate of the transistor 220. The drain of transistor 220 is connected to a second input (Input2) of the current mirror 214. The operational amplifier 218 and the transistor 220 cause the voltage, U, to be copied to the source of the transistor 220. Thus, the total voltage drop across the resistor 222 is equal to U.

The circuit 200 generates a first current, I1, which flows through the transistor 206 and the resistor 208. The magnitude of the first current, I1, equals the voltage, U, divided by the resistances of resistors 210 and 212. The circuit 200 generates a second current, I2, which flows through the transistor 220 and the resistor 222. The magnitude of the second current, I2, equals the voltage, U, divided by the resistance of resistor 222. The current mirror 214 causes a current $I_H$ to be generated at its output, which flows through the Hall plate 224. The current $I_H$ according to one embodiment equals the sum of the first two currents I1 and I2. The Hall plate 224 generates an output voltage, $V_H$, which is measured at output terminals 226A and 226B, and which varies based on the strength of a magnetic field applied to the Hall plate 224. In another embodiment, the current $I_H$ is given by the following Equation IX:

$$I_H = I1 + x \cdot I2 \quad \text{Equation IX}$$

Where:
x=scaling factor.

As indicated by the line across the second input of the current mirror 214, the current I2 is variable. The scaling factor, x, can be trimmed finely by switching a PMOS input transistor parallel to the second input of the current mirror 214 to adjust the current I2. In another embodiment, instead of trimming the current mirror 214, the voltage at the positive input terminal of the operational amplifier 204 or 218 can be trimmed.

In one embodiment, the second current, I2, is trimmed to generate a current $I_H$ that varies with stress in such a manner as to cancel the stress dependence of the Hall plate 224, and such that the overall magnetic sensitivity of the Hall sensor 200 is constant with respect to mechanical stress. The copying of voltages from two different voltages sources 202 and 216 onto the two different resistors 208 and 222, and mixing the two currents I1 and I2 to generate the Hall current, $I_H$, as shown in FIG. 3 and described above, is similar to connecting the resistors 108 and 110 (shown in FIG. 2) in parallel.

Figure 4:
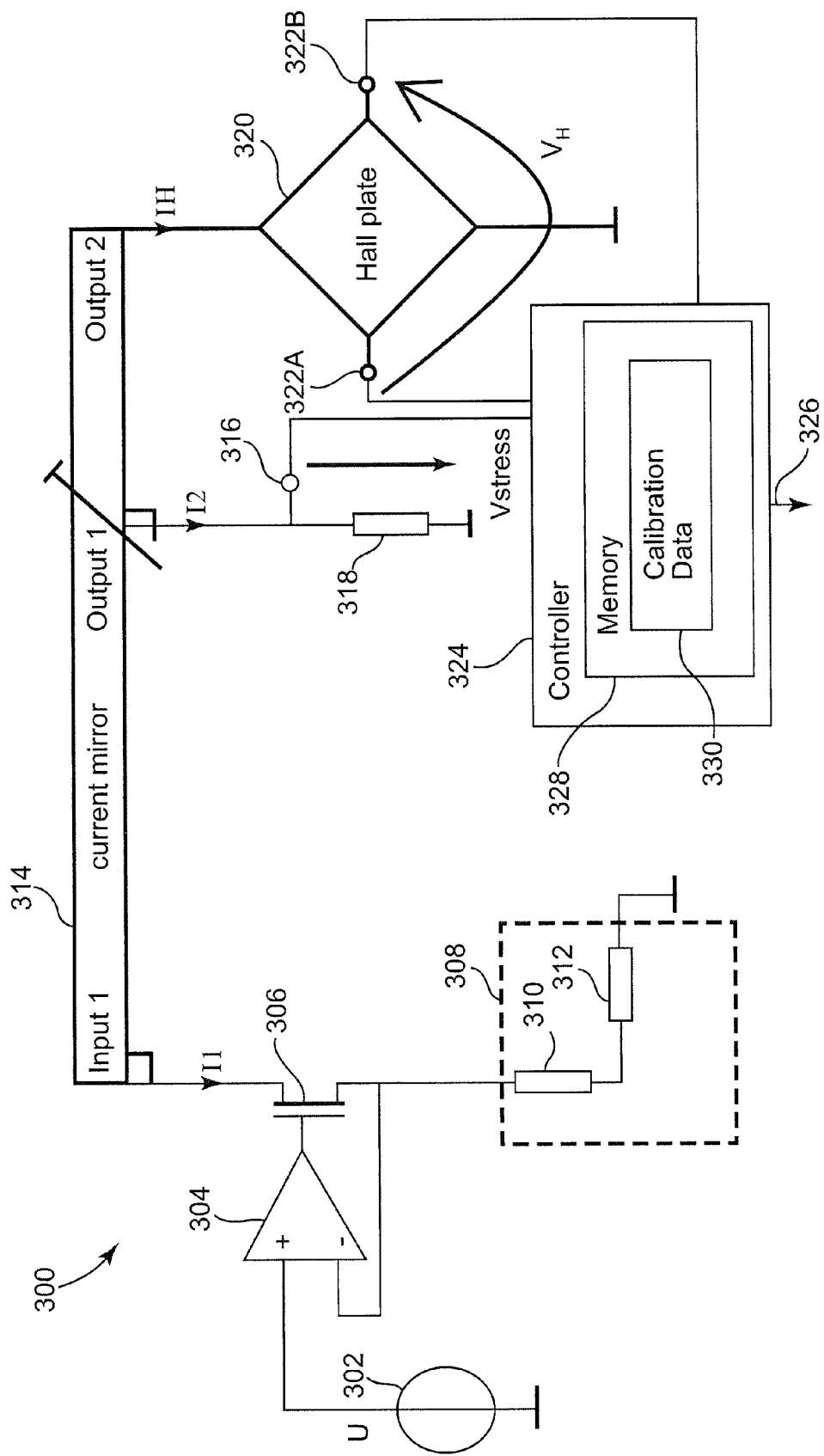
FIG. 4 is a block diagram illustrating a stress-insensitive Hall sensor integrated circuit according to yet another embodiment.

FIG. 4 is a block diagram illustrating a stress-insensitive Hall sensor integrated circuit 300 according to yet another embodiment. Circuit 300 includes a voltage source 302, operational amplifier 304, transistor 306, lateral n-type resistor-L 308, current mirror 314, vertical n-type resistor 318, Hall plate 320, and controller 324. The lateral n-type resistor-L 308 includes two lateral n-type resistor portions or resistors 310 and 312, which are oriented perpendicularly with respect to each other, and which are connected in series with each other.

In one embodiment, transistor 306 is an NMOS FET. Voltage source 302 provides a voltage, U, to the positive input terminal of the operational amplifier 304. The negative input terminal of the operational amplifier 304 is connected between resistor 308 and the source of transistor 306. The output of the operational amplifier 304 is connected to the gate of the transistor 306. The drain of transistor 306 is connected to the input of the current mirror 314. In one embodiment, current mirror 314 is a PMOS current mirror. The operational amplifier 304 and the transistor 306 cause the voltage, U, to be copied to the source of the transistor 306. Thus, the total voltage drop across the resistor 308 is equal to U.

The circuit 300 generates a first current, I1, which flows through the transistor 306 and the resistor 308. The magnitude of the first current, I1, equals the voltage, U, divided by the resistances of resistors 310 and 312. The current mirror 314 causes a current I2 to be generated at its first output (output1), which flows through resistor 318. The current mirror 314 causes a current $I_H$ to be generated at its second output (output2), which flows through the Hall plate 320. The Hall plate 320 generates an output voltage, $V_H$, which is measured at output terminals 322A and 322B, and which varies based on the strength of a magnetic field applied to the Hall plate 320.

The current I2 flowing through resistor 318 results in a voltage drop, $V_{stress}$, across the resistor 318. The voltage, $V_{stress}$, is not very sensitive to temperature, but is sensitive to mechanical stress. Thus, the voltage, $V_{stress}$, is indicative of the level of stress on the circuit 300. In the illustrated embodiment, an output terminal 316 is connected to a controller 324, which continually measures and digitizes the voltage, $V_{stress}$, to provide digital stress values indicative of the level of mechanical stress on the circuit 300. In one embodiment, controller 324 is also coupled to the output terminals 322A and 322B of the Hall plate, and the controller 324 continually measures and digitizes the Hall output voltage, $V_H$. Controller 324 then compensates the digital Hall output values based on the digital stress values, and outputs compensated Hall output values 326. The stress compensation cancels the stress dependence of the Hall plate 320 such that the overall magnetic sensitivity of the Hall sensor 300 is constant with respect to mechanical stress. In the illustrated embodiment, the controller 324 includes a memory 328 that stores calibration data 330. In one embodiment, controller 324 performs the stress compensation based on the stored calibration data 330. In one embodiment, the memory 328 is an EEPROM.

If the temperature dependence of the lateral resistors 310 and 312 and the vertical resistor 318 are different (e.g., possibly because identical wells are not used, or the resistors have different contact resistances), the different temperature dependence may be compensated for by designing the temperature coefficient of the input voltage, U, accordingly. Also, the current mirror 314 can be trimmed at the first output (as shown by the line across the first output in FIG. 4), or at the input.

In the embodiment illustrated in FIG. 4, the resistor-L 308 is used for the current bias of the Hall plate 320. In another embodiment, the vertical n-type resistor 318 is used to define the current through the Hall plate 320 (e.g., by swapping resistors 308 and 318).

Figure 5:
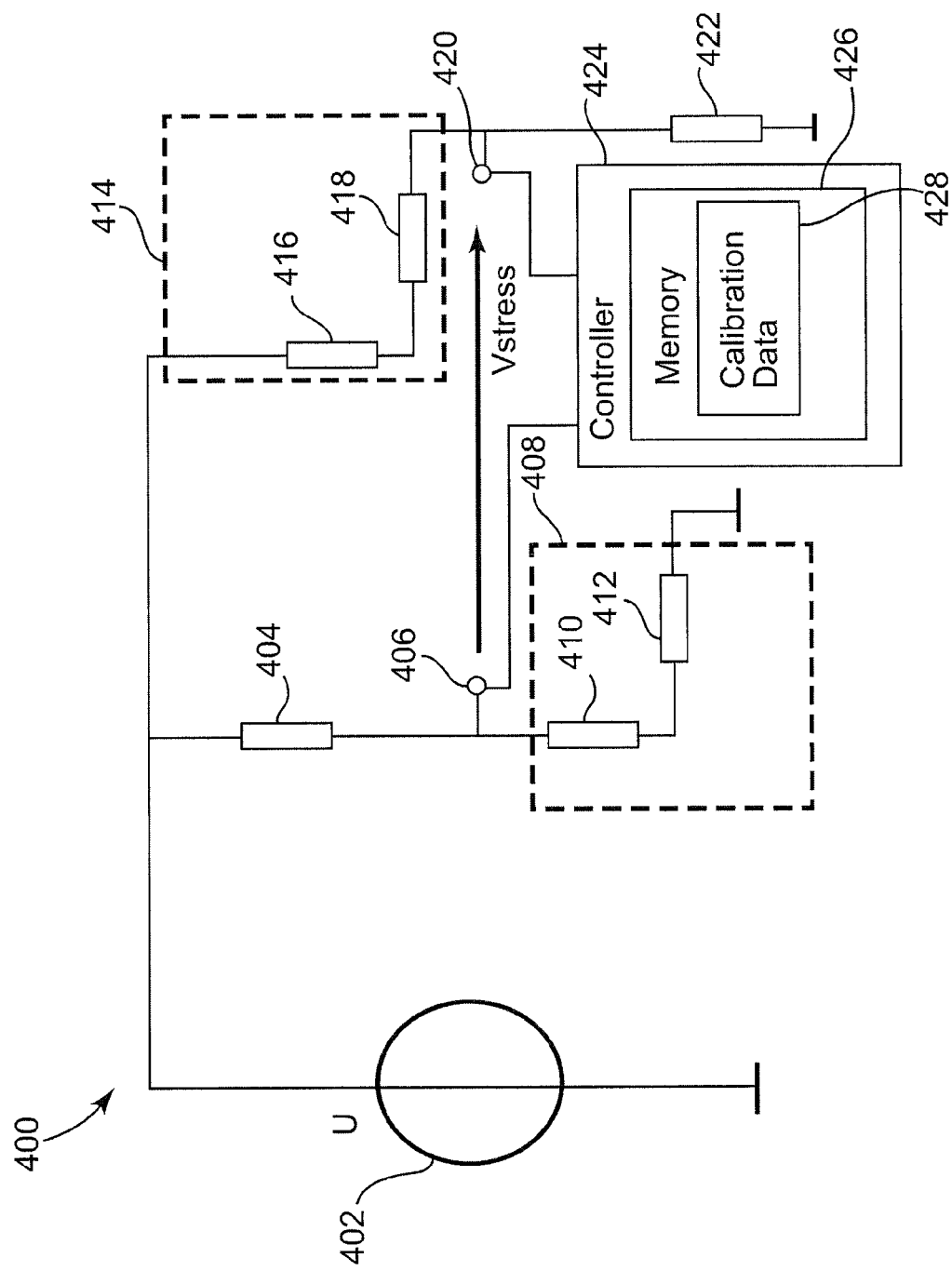
FIG. 5 is a block diagram illustrating an integrated stress sensor circuit according to one embodiment.

FIG. 5 is a block diagram illustrating an integrated stress sensor circuit 400 according to one embodiment. Circuit 400 includes a voltage source 402, vertical n-type resistors 404 and 422, lateral n-type resistor-Ls 408 and 414, and controller 424. The lateral n-type resistor-L 408 includes two lateral n-type resistor portions or resistors 410 and 412, which are oriented perpendicularly with respect to each other, and which are connected in series with each other and with the vertical n-type resistor 404. The lateral n-type resistor-L 414 includes two lateral n-type resistor portions or resistors 416 and 418, which are oriented perpendicularly with respect to each other, and which are connected in series with each other and with the vertical n-type resistor 422. The configuration of the circuit 400 is referred to as an H-bridge.

Resistors 404 and 408 are connected in parallel with resistors 414 and 422. The voltage source 402 generates a voltage, U, which is dropped across resistors 404 and 408, as well as across resistors 414 and 422. The current flowing through the resistors 404, 408, 414, and 422 results in a voltage difference, $V_{stress}$, between output terminals 406 and 420. The voltage, $V_{stress}$, is not very sensitive to temperature, but is sensitive to mechanical stress. Thus, the voltage, $V_{stress}$, is indicative of the level of stress on the circuit 400. In the illustrated embodiment, the output terminals 406 and 420 are connected to a controller 424, which continually measures and digitizes the voltage, $V_{stress}$, to provide digital stress values indicative of the level of mechanical stress on the circuit 400. In one embodiment, prior to normal operation, the circuit 400 is configured to produce a zero output voltage, $V_{stress}$, at a reference stress level. In the illustrated embodiment, the controller 424 includes a memory 426 that stores calibration data 428. In one embodiment, controller 424 performs digital stress compensation, such as compensation of Hall output voltages, based on the stored calibration data 428. In one embodiment, the memory 426 is an EEPROM.

Figure 6:
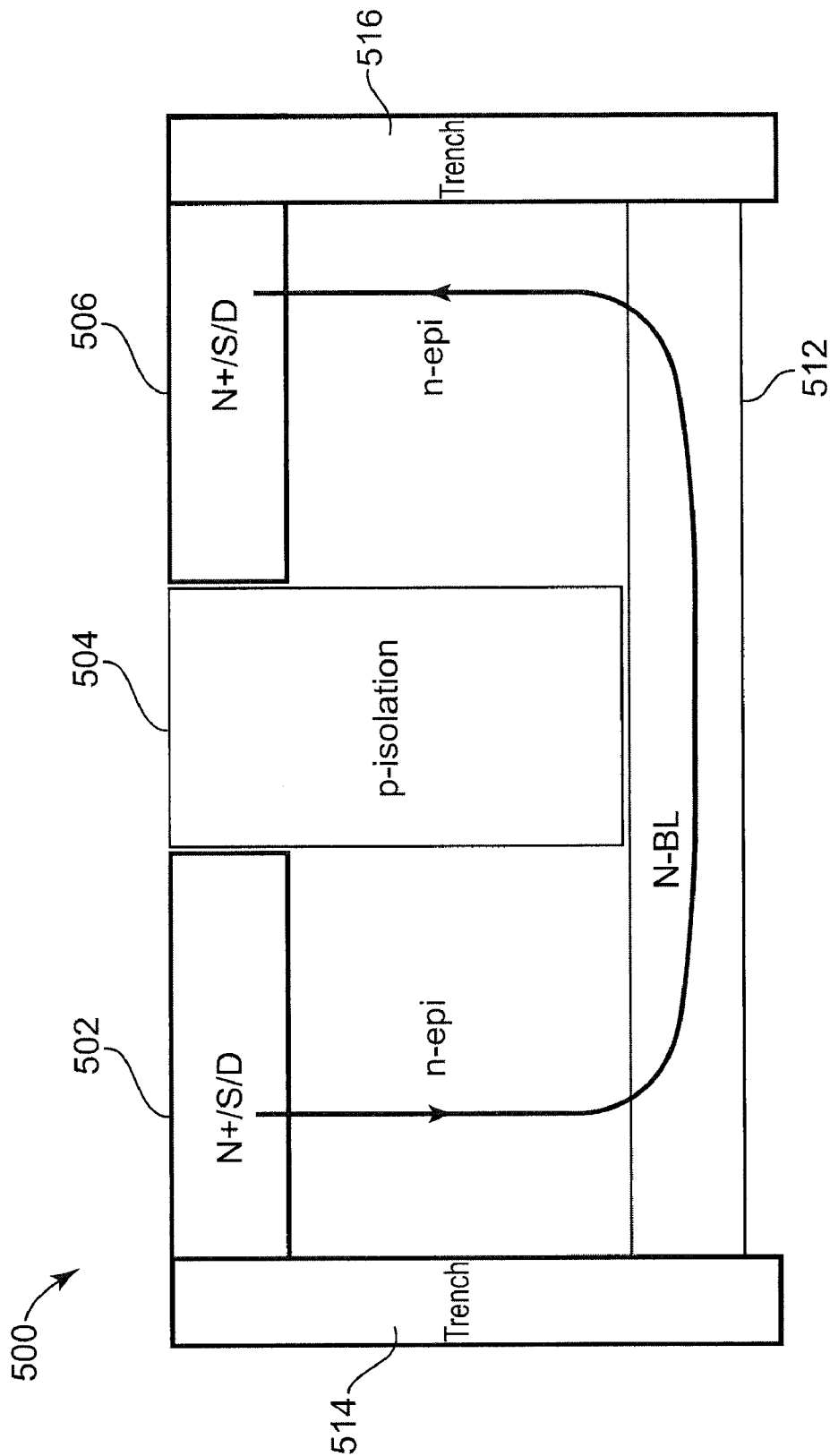
FIG. 6 is a diagram illustrating the construction of a vertical resistor according to one embodiment.

FIG. 6 is a diagram illustrating the construction of a vertical resistor 500 according to one embodiment. In the illustrated embodiment, the vertical resistor 500 is made using a BiCMOS technology. In one embodiment, vertical resistors 108, 222, 318, 404, and 422 are constructed in the same manner as vertical resistor 500. Vertical resistor 500 includes N+ source/drain (N+/S/D) diffusion regions 502 and 506, a p-doped isolation region 504, n-doped epitaxial (n-epi) layers 508 and 510, an N-doped buried layer (N-BL) 512, and trenches 514 and 516. The arrows in FIG. 6 show the direction of current flow through the resistor 500. The current begins in the N+/S/D 502 and flows vertically downward through the n-epi layer 508 and enters the N-BL layer 512. The current flows horizontally in the N-BL layer 512 and enters the n-epi layer 510. The current then flows vertically upwards through the n-epi layer 510 and enters the N+/S/D 506. In one embodiment, the N-BL layer 512 is highly doped and, therefore, has a small resistance and small piezo-coefficients, and essentially acts like a ground plane. Since N-BL layer 512 has a small resistance, this lateral path for the current does not contribute much to the stress dependence of the vertical resistor 500, and almost the entire stress dependence comes from the vertical path of the current. The trenches 514 and 516 provide lateral isolation of the N-BL layer 512. In one embodiment, the trenches 514 and 516 are deep poly-silicon trenches or deep p-diffusions.

Many of the resistor structures 500 may be switched in series to increase the overall resistance to any desired value. Instead of the n-epi layers 508 and 510 used in one embodiment, in another embodiment, a special n-Hall doping or a standard n-CMOS-well is used.

Embodiments of the present invention provide numerous advantages over prior stress sensing techniques. One embodiment senses mechanical stress using at least one n-type lateral resistor-L and at least one n-type vertical resistor. The resistance of the lateral resistor-L is compared with the resistance of the vertical resistor. The ratio depends primarily on mechanical stress and only a minimum amount on temperature. Vertical and lateral n-type resistors have the same temperature behavior, if the same wells are used. If the doping concentration of the wells is slightly different, this will change the temperature coefficient only moderately. If identical wells are used for both resistors, the stress sensor has constant output voltage at zero stress.

A vertical resistor is much more sensitive to mechanical stress than a lateral resistor-L, and more sensitive than a Hall plate. The resistance of a vertical resistor depends on mechanical stress as shown in the following Equation X:

$$R_V = R_{V0}(1+\pi_{12}(\sigma_{xx}+\sigma_{yy})+\pi_{11}\sigma_{zz}) \quad \text{Equation X}$$

Where:
$R_V$=resistance of vertical resistor;
$R_{V0}$=resistance of vertical resistor at zero stress;
$\pi_{11}$ and $\pi_{12}$=piezo-resistivity coefficients; and
$\sigma_{xx}$, $\sigma_{yy}$, and $\sigma_{zz}$=normal stress components.

A lateral resistor-L has a stress dependence of −24.4%/GPa, while a vertical resistor has a stress dependence of 53.4%/GPa, nearly double that of the lateral resistor-L stress dependence. Thus, by copying a voltage onto a lateral n-type resistor-L to produce a current and injecting that current into a vertical n-type resistor (e.g., see FIG. 4 and corresponding description), the output voltage ($V_{stress}$) has a stress sensitivity of 24.4+53.4=77.8%/GPa, which is nearly three times larger than some prior stress sensors. One embodiment provides a Hall sensor integrated circuit with a stable magnetic sensitivity better than 1% when measured in a standard package with ambient moisture and compared to a dry package (i.e., after baked out in an oven at greater than 100° C. for one hour).

In addition, both the lateral and vertical resistors according to one embodiment use the same type of conductors (i.e., electrons in contrast to holes). The two types of resistors also use the same or at least very similar wells in one embodiment, which are produced by the same production steps. Therefore, if the doping concentration is slightly too high or too low, it will affect both resistors identically and leave their ratio unchanged.

To help ensure proper operation in the field, a stress sensor should be calibrated prior to normal operation. In one embodiment, stress compensation in a Hall sensor integrated circuit is performed according to the following Equation XI:

$$H_c(T, \sigma) = \frac{H(T, \sigma)}{1 + EPC(T, \sigma_{ref})(S(T, \sigma) - S(T, \sigma_{ref}))} \quad \text{Equation XI}$$

Where:
 $H_c$=Hall signal after stress compensation;
 T=temperature;
 σ=stress;
 H=uncompensated (raw) Hall signal;
 EPC=effective piezo coefficient;
 $\sigma_{ref}$=reference stress; and
 S=stress sensor signal.

When the three normal stress components ($\sigma_{xx}$, $\sigma_{yy}$, and $\sigma_{zz}$) are included, Equation XI becomes the following Equation XII:

$$H_c(T, \sigma_{xx} + \sigma_{yy}, \sigma_{zz}) = \frac{H(T, \sigma_{xx} + \sigma_{yy}, \sigma_{zz})}{1 + EPC(T, \sigma_{xx,ref} + \sigma_{yy,ref}, \sigma_{zz,ref})} \\ (S(T, \sigma_{xx} + \sigma_{yy}, \sigma_{zz}) - S(T, \sigma_{xx,ref} + \sigma_{yy,ref}, \sigma_{zz,ref}))$$
Equation XII In order to evaluate Equation XI (or Equation XII), the integrated circuit needs to "remember" the stress signal S(T, $\sigma_{ref}$) at the time of calibration (i.e., the reference stress over the entire temperature range). In one embodiment, after the integrated circuit is packaged, the chip is tested over the desired temperature range, and a second order fit of the stress signal is stored as part of the calibration data 330 or 428 in the on-chip memory 328 or 426.

The effective piezo coefficient (EPC) in Equations XI and XII is a calibration parameter that depends upon the piezo coefficients of the Hall plate and the resistors of the stress sensor, and upon the reference stress. It is desirable to have an accurate value for the EPC to help ensure a high quality of stress compensation. A method for determining the EPC for an integrated circuit is described in further detail below.

The signal of a stress sensor according to one embodiment has a stress dependence as given in the following Equation XIII:

$$\frac{R_V^{(n)}}{R_L^{(n)}} = \frac{R_V^{(n)}}{R_{L,1}^{(n)} + R_{L,2}^{(n)}} \propto \frac{1 + \pi_{12}^{(n)}(\sigma_{xx} + \sigma_{yy}) + \pi_{11}^{(n)}\sigma_{zz}}{1 + \frac{\pi_{11}^{(n)} + \pi_{12}^{(n)}}{2}(\sigma_{xx} + \sigma_{yy}) + \pi_{12}^{(n)}\sigma_{zz}} \approx$$
Equation XIII $$1 + q_1(\sigma_{xx} + \sigma_{yy}) - q_2\sigma_{zz}$$

Where:
 $R_V^{(n)}$=resistance of vertical n-type resistor;
 $R_L^{(n)}$=resistance of lateral n-type resistor-L;
 $R_{L,1}^{(n)}$=resistance of first resistor or resistor portion of the lateral n-type resistor-L, $R_L^{(n)}$;
 $R_{L,2}^{(n)}$=resistance of second resistor or resistor portion of the lateral n-type resistor-L, $R_L^{(n)}$;
 $\pi^n{}_{11}$ and $\pi^n{}_{12}$=piezo-resistivity coefficients of n-type resistor;
 $\sigma_{xx}$, $\sigma_{yy}$, and $\sigma_{zz}$=normal stress components;
 $q_1$=77.8%/GPa; and
 $q_2$=155.6%/Gpa.

The magnetic sensitivity of the Hall plate according to one embodiment has a stress dependence as given in the following Equation XIV:

$$\frac{S_i^{(n)}}{R_L^{(n)}} \propto \frac{1 + P_{12}^{(n)}(\sigma_{xx} + \sigma_{yy}) + P_{11}^{(n)}\sigma_{zz}}{1 + \frac{\pi_{11}^{(n)} + \pi_{12}^{(n)}}{2}(\sigma_{xx} + \sigma_{yy}) + \pi_{12}^{(n)}\sigma_{zz}} \approx$$
Equation XIV $$1 + q_3(\sigma_{xx} + \sigma_{yy}) - q_4\sigma_{zz}$$

Where:
 $S_i^{(n)}$=current-related magnetic sensitivity of n-doped Hall sensor;
 $R_L^{(n)}$=resistance of lateral n-type resistor-L;
 $P^{(n)}{}_{11}$ and $P^{(n)}{}_{12}$=piezo-Hall coefficients for an n-doped Hall sensor;
 $\pi^{(n)}{}_{11}$ and $\pi^{(n)}{}_{12}$=piezo-resistivity coefficients of n-type resistor;
 $\sigma_{xx}$, $\sigma_{yy}$, and $\sigma_{zz}$=normal stress components;
 $q_3$=−69.0%/GPa; and
 $q_4$=−141.4%/Gpa.

In Equations XIII and XIV, the q coefficients have the following values: $q_1$=77.8%/GPa, $q_2$=155.6%/GPa, $q_3$=−69.0%/GPa, $q_4$=−141.4%/GPa. Thus, the approximation in the following Equation XV holds true with an error of only 2.5%:

$$q_3/q_1 \cong q_4/q_2 \quad \text{Equation XV}$$

As the above equations indicate, the relationship between stress sensor output and magnetic sensitivity of the Hall plate is the same for in-plane normal stress ($\sigma_{xx}+\sigma_{yy}$) and out-of-plane (i.e., vertical) normal stress ($\sigma_{zz}$). Thus, the EPC given in Equation XII can be calculated by exerting 2 different pressure levels normal to the integrated circuit package surface and applying a magnetic field to the integrated circuit during the test, while reading out the stress sensor and the Hall sensor. This process is described in further detail below with reference to FIGS. 7-9.

As mentioned above, vertical stress ($\sigma_{zz}$) on a semiconductor die in typical packages is negligible because of the flat layered structure of a typical package, and, therefore, one embodiment measures and compensates only the in-plane normal stress components ($\sigma_{xx}+\sigma_{yy}$). The EPC value depends upon the reference values for these stress components. However, it is difficult to apply in-plane pressure to a package without doing any harm to the reliability or integrity of the package. Because of the relationship between in-plane stress and vertical stress, as discussed above, an EPC value can be determined by applying out-of-plane (vertical) stress, and this EPC value can then be used to compensate in-plane stress.

Figure 7:
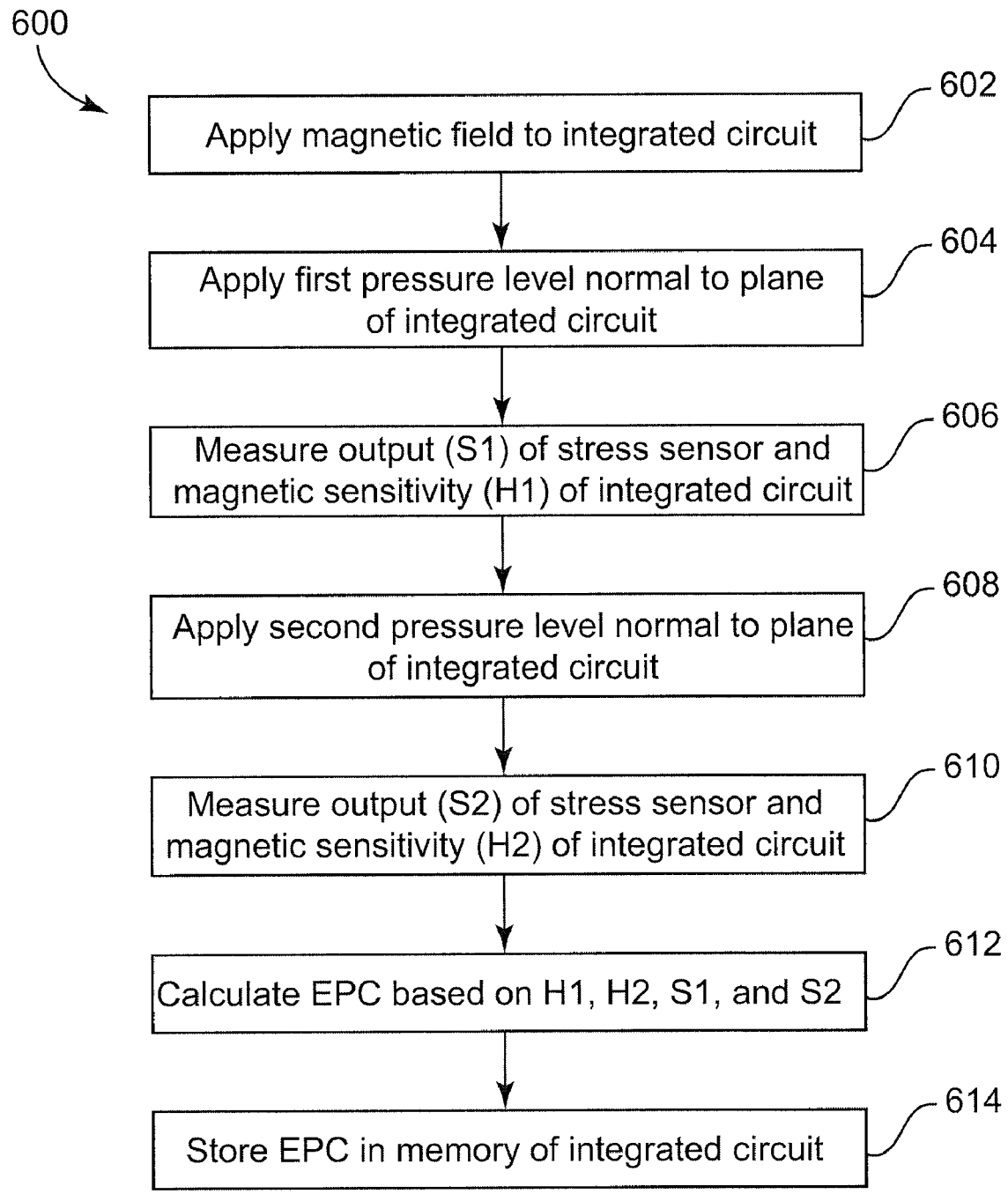
FIG. 7 is a flow diagram illustrating a method for calculating an effective piezo coefficient (EPC) of an integrated circuit according to one embodiment.

FIG. 7 is a flow diagram illustrating a method 600 for calculating an effective piezo coefficient (EPC) of an integrated circuit according to one embodiment. The method 600 will be described with reference to a Hall sensor integrated circuit that includes a stress sensor, although the method 600 is also applicable to other types of integrated circuits. At 602 of method 600, a magnetic field is applied to the integrated circuit. Steps 604-610 of method 600 are then performed while the magnetic field is being applied. At 604, a first pressure level is externally applied to the integrated circuit normal to the plane of the integrated circuit (e.g., onto the front or back side of the integrated circuit package). It may be desirable to apply zero pressure at 604, since it is useful to perform measurements at zero normal reference stress (i.e., $\sigma_{zz}=0$). Thus, in one embodiment, step 604 is skipped. However, in certain cases, a small pressure may need to be applied (e.g., in order to define the position of the sample with respect to magnetic field).

At 606, the output (S1) of the stress sensor and the magnetic sensitivity (H1) of the integrated circuit are measured while the first pressure level is being applied. At 608, a second pressure level is externally applied to the integrated circuit normal to the plane of the integrated circuit. In one embodiment, the second pressure level is large enough to produce a significant change in magnetic sensitivity (in order to be able to measure it precisely), yet low enough not to endanger the mechanical integrity of the integrated circuit package. Since the Hall plate responds with at least 88%/GPa in one embodiment, it is reasonable to apply 23 MPa at 608. In one embodiment, the integrated circuit package has dimensions of 4 mm×4 mm×1 mm. Thus, the integrated circuit has a cross-sectional area of 16 mm², and the external force applied at 608 is 368N. It is desirable to apply homogeneous stress to the sensor package at 604 and 608. Thus, in one embodiment, the external pressure is applied at 604 and 608 with a stamp having a flat surface, which is pressed onto the package surface to produce a force that is perpendicular to the surface. The stamp covers the complete surface of the package in one embodiment, or at least that part of the chip that contains all relevant devices for the stress compensation circuit.

At 610, the output (S2) of the stress sensor and the magnetic sensitivity (H2) of the integrated circuit are measured while the second pressure level is being applied. In one embodiment, the temperature is kept constant or substantially constant during the measurements at 606 and 610.

At 612, the EPC of the integrated circuit is determined based on the values of H1, H2, S1, and S2. In one embodiment, the EPC is calculated according to the following Equation XVI:

$$EPC=(H2/H1-1)/(S2-S1)$$ Equation XVI

At 614, the EPC value calculated at 612 is stored in an on-chip memory within the integrated circuit, and is used by the integrated circuit to compensate for in-plane mechanical stress in the integrated circuit.

In addition to being applicable to a Hall sensor integrated circuit with a lateral resistor-L and a vertical resistor, such as shown in FIG. 4, the method 600 is also applicable to other types of sensors or circuits that are sensitive to mechanical stress and with stress-sensitivities that follow the rule given in Equation XV above. A few examples include constant current references, temperature sensors, bandgap-circuits, and on-chip oscillators.

Figure 8:
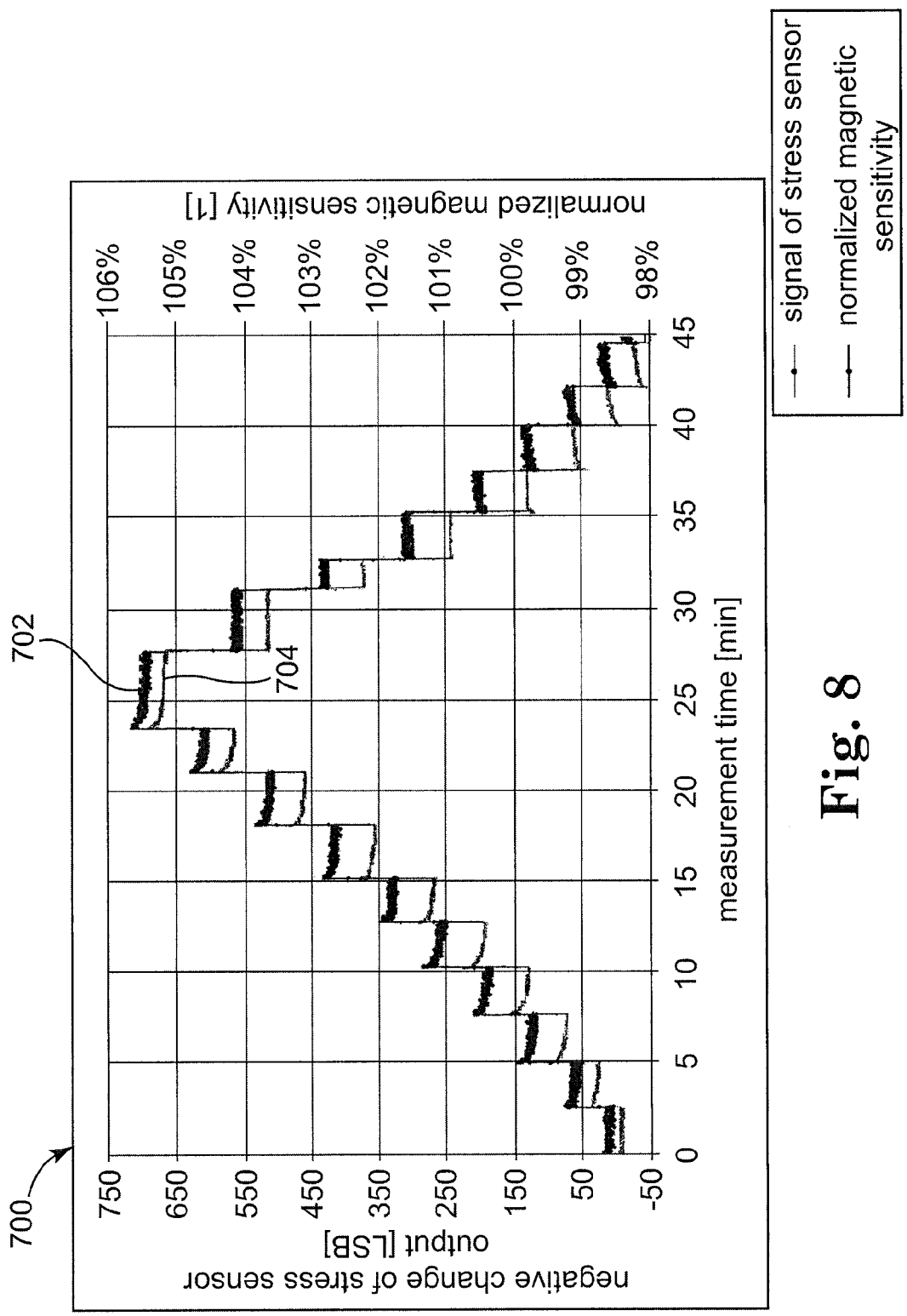
FIG. 8 is a diagram illustrating a graph of stress sensor output and normalized magnetic sensitivity of a Hall sensor integrated circuit at a plurality of different pressure levels according to one embodiment.

FIG. 8 is a diagram illustrating a graph 700 of stress sensor output and normalized magnetic sensitivity of a Hall sensor integrated circuit at a plurality of different pressure levels according to one embodiment. The data shown in graph 700 were measured at room temperature. The horizontal axis of graph 700 represents time (in minutes). The left vertical axis represents the negative change of the stress sensor output (in least significant bit (LSB) units), and the right vertical axis represents normalized magnetic sensitivity of the Hall sensor. Pressure was applied to the integrated circuit in steps from zero up to a maximum value, and decreased in steps down to zero, and the stress sensor output changed accordingly, as shown by curve 702. The stress sensor responded to the applied pressure by a change in output code between 0 and −730 LSB. As shown by curve 704, the magnetic sensitivity of the Hall sensor changed by about 7% during the test.

Figure 9:
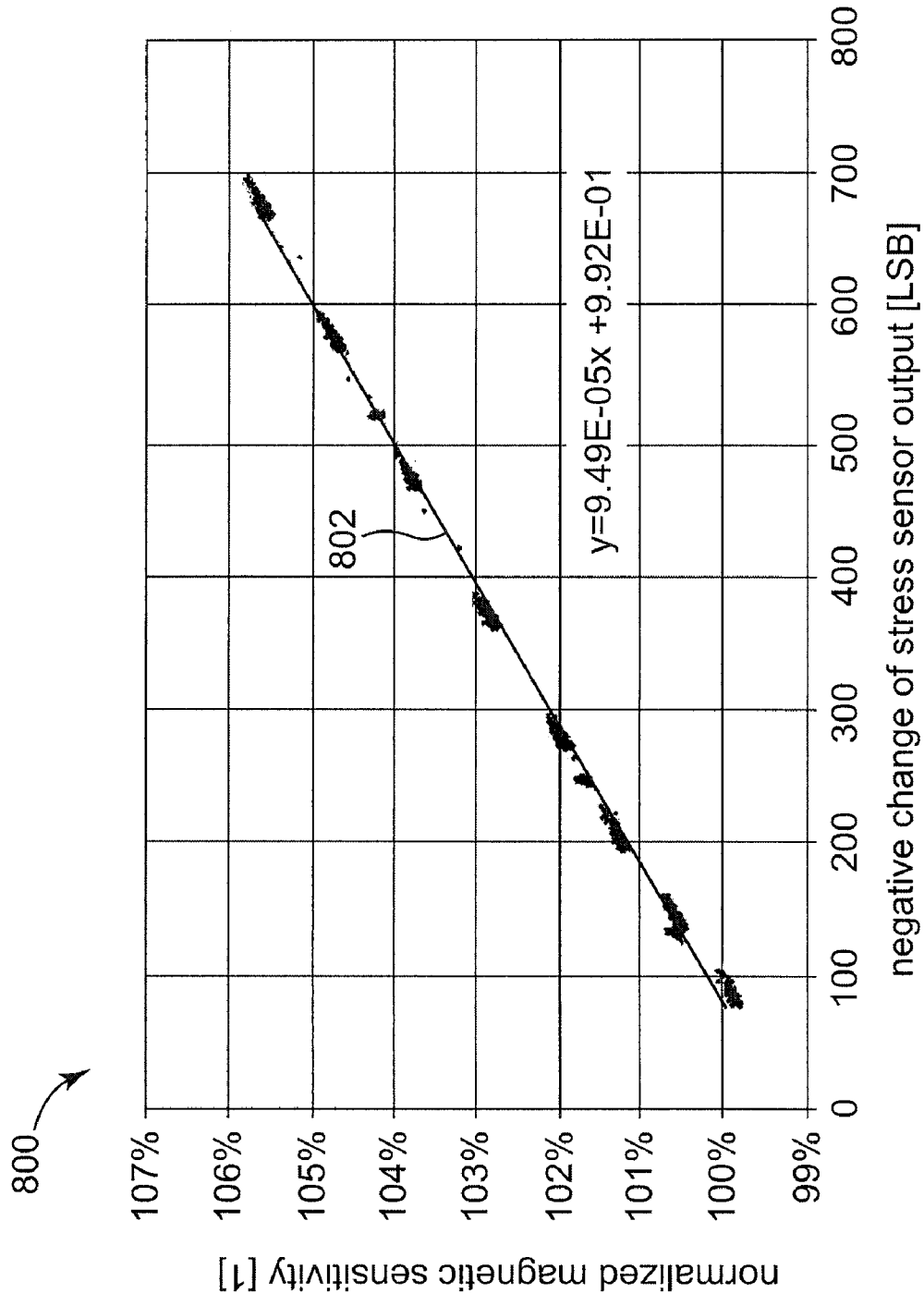
FIG. 9 is a diagram illustrating a graph of normalized magnetic sensitivity versus stress sensor output using the data from FIG. 8.

FIG. 9 is a diagram illustrating a graph 800 of normalized magnetic sensitivity versus stress sensor output using the data from FIG. 8. The vertical axis represents normalized magnetic sensitivity of the Hall sensor, and the horizontal axis represents the negative change of the stress sensor output (in least significant bit (LSB) units). The graph 800 shows that there is an excellent correlation between stress sensor output and magnetic sensitivity. As shown in graph 800, the data lies along a line 802. The equation for the line is y=9,49E-05x+ 9,92E-01. The slope of the line 802 is the EPC of the Hall sensor integrated circuit (i.e., the EPC equals about −95 ppm/LSB).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit, comprising:
    a semiconductor die;
    a stress sensing element comprising a first lateral resistor and a first vertical resistor, the stress sensing element formed in the semiconductor die and configured to indicate a level of at least one stress component within the semiconductor die, wherein the first lateral resistor is configured such that current flows through the first lateral resistor predominantly in a lateral direction in the semiconductor die, and wherein the first vertical resistor is configured such that current flows through the first vertical resistor predominantly in a vertical direction in the semiconductor die.

2. The integrated circuit of claim 1, wherein the first lateral resistor and the first vertical resistor are both n-type resistors, and wherein the first lateral resistor and the first vertical resistor have a doping concentration that is substantially the same.

3. The integrated circuit of claim 2, wherein the first lateral resistor is configured in an L-layout.

4. The integrated circuit of claim 1, wherein the first lateral resistor and the first vertical resistor are connected in series.

5. The integrated circuit of claim 1, wherein the first lateral resistor and the first vertical resistor are connected in parallel.

6. The integrated circuit of claim 1, wherein the integrated circuit is a Hall sensor integrated circuit.

7. The integrated circuit of claim 1, wherein the stress sensing element is configured to generate a stress signal that is indicative of the level of the at least one stress component.

8. The integrated circuit of claim 7, and further comprising:
a controller for compensating an output signal of the integrated circuit based on the stress signal.

9. The integrated circuit of claim 8, wherein the controller is configured to compensate the output signal digitally.

10. The integrated circuit of claim 1, and further comprising:
an operational amplifier and a transistor that are configured to copy a source voltage across at least one of the first lateral resistor and the first vertical resistor.

11. The integrated circuit of claim 10, wherein the first lateral resistor and the first vertical resistor are connected together in series, and wherein a sum of a voltage drop across the first lateral resistor and a voltage drop across the first vertical resistor equals the source voltage.

12. The integrated circuit of claim 1, and further comprising:
a first operational amplifier and a first transistor that are configured to copy a first source voltage across the first lateral resistor; and
a second operational amplifier and a second transistor that are configured to copy a second source voltage across the first vertical resistor.

13. The integrated circuit of claim 1, and further comprising:
an operational amplifier and a transistor that are configured to copy a source voltage across the first lateral resistor; and
a current mirror configured to mirror a current through the first lateral resistor onto the first vertical resistor.

14. The integrated circuit of claim 1, and further comprising:
a second lateral resistor and a second vertical resistor.

15. The integrated circuit of claim 14, wherein the first lateral resistor is connected in series with the first vertical resistor, and wherein the second lateral resistor is connected in series with the second vertical resistor.

16. The integrated circuit of claim 15, wherein the first lateral resistor and the first vertical resistor are connected in parallel with the second lateral resistor and the second vertical resistor.

17. A method of compensating for stress in an integrated circuit, comprising:
providing an integrated stress sensing element in the integrated circuit, wherein the stress sensing element comprises a first lateral resistor and a first vertical resistor, wherein the first lateral resistor is configured such that current flows through the first lateral resistor predominantly in a lateral direction in the integrated circuit, and wherein the first vertical resistor is configured such that current flows through the first vertical resistor predominantly in a vertical direction in the integrated circuit;
applying a voltage across at least one of the first lateral resistor and the first vertical resistor, thereby generating at least one current through at least one of the first lateral resistor and the first vertical resistor; and
generating a stress insensitive output signal based on the at least one current.

18. The method of claim 17, wherein the first lateral resistor and the first vertical resistor are both n-type resistors.

19. The method of claim 17, wherein the integrated circuit is a Hall sensor integrated circuit.

20. A method of determining a calibration parameter for use in compensating lateral stress in an integrated circuit, comprising:
applying a magnetic field to the integrated circuit;
applying a first vertical pressure level normal to a plane of the integrated circuit;
measuring a first stress sensor output value and a first magnetic sensitivity of the integrated circuit while the magnetic field and the first pressure level are being applied;
applying a second vertical pressure level normal to the plane of the integrated circuit;
measuring a second stress sensor output value and a second magnetic sensitivity of the integrated circuit while the magnetic field and the second pressure level are being applied; and
calculating the calibration parameter based on the first and second output values and the first and second magnetic sensitivities.

21. The method of claim 20, wherein the calibration parameter is an effective piezo coefficient.

22. The method of claim 21, wherein the calibration parameter is calculated based on the following equation:

$$\text{calibration parameter} = (H2/H1-1)/(S2-S1)$$

where:
H1=the first magnetic sensitivity;
H2=the second magnetic sensitivity;
S1=the first stress sensor output value; and
S2=the second stress sensor output value.

23. The method of claim 20, and further comprising:
storing the calculated calibration parameter in a memory of the integrated circuit.

24. The method of claim 20, wherein the integrated circuit includes an integrated stress sensor for generating the first and second stress sensor output values, and wherein the stress sensor comprises a first lateral resistor and a first vertical resistor.

25. The method of claim 20, wherein the integrated circuit is a Hall sensor integrated circuit.

* * * * *